US010310198B1

(12) United States Patent
Yatskov et al.

(10) Patent No.: US 10,310,198 B1
(45) Date of Patent: Jun. 4, 2019

(54) APPARATUS, SYSTEM, AND METHOD FOR IMPROVING HEAT TRANSFER BETWEEN HEATSINKS AND OPTICAL TRANSDUCERS WITHIN TELECOMMUNICATIONS DEVICES

(71) Applicant: Juniper Networks, Inc., Sunnyvale, CA (US)

(72) Inventors: Alexander I. Yatskov, Manteca, CA (US); Eeshitw Kaushal Singh, Kolkata (IN)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/937,787

(22) Filed: Mar. 27, 2018

(51) Int. Cl.
  *G02B 6/42* (2006.01)
  *H05K 7/20* (2006.01)

(52) U.S. Cl.
  CPC ......... *G02B 6/4269* (2013.01); *G02B 6/4261* (2013.01); *H05K 7/2039* (2013.01)

(58) Field of Classification Search
  CPC .. G02B 6/4268; G02B 6/4269; G02B 6/4261; G02B 6/4284; H05K 7/2039; H05K 7/20409; H05K 7/20427; H05K 7/2049
  USPC ................... 385/92; 361/704, 709, 711, 714; 398/139, 200, 201, 212, 214
  See application file for complete search history.

(56) References Cited

U.S. PATENT DOCUMENTS

| | | | | |
|---|---|---|---|---|
| 4,825,337 A * | 4/1989 | Karpman | ........... | H05K 7/20545 165/185 |
| 4,993,482 A * | 2/1991 | Dolbear | ................... | F28F 1/122 165/185 |
| 5,161,087 A * | 11/1992 | Frankeny | ............ | H01L 23/4093 165/185 |
| 5,273,438 A * | 12/1993 | Bradley | ............. | G01R 1/07307 29/884 |
| 6,416,330 B1 * | 7/2002 | Yatskov | ............. | H01R 12/7088 439/65 |
| 6,490,160 B2 | 12/2002 | Dibene | | |
| 7,036,574 B2 * | 5/2006 | Thompson | .......... | F28D 15/0233 165/185 |
| 7,177,156 B2 * | 2/2007 | Yatskov | .................... | G06F 1/20 257/E23.083 |
| 7,180,744 B2 * | 2/2007 | Chen | ................... | H01L 23/4093 165/80.3 |

(Continued)

OTHER PUBLICATIONS

Heat Pipes and Vapor Chambers—What's the Difference?; https://celsiainc.com/blog-heat-pipes-and-vapor-chambers-whats-the-difference (Mar. 4, 2015).

(Continued)

*Primary Examiner* — Robert Tavlykaev
(74) *Attorney, Agent, or Firm* — FisherBroyles, LLP

(57) ABSTRACT

The disclosed apparatus may include (1) a housing unit that houses an optical transducer within a telecommunications device, (2) a heatsink that is coupled to a movable shaft secured to a joint within the telecommunications device, and (3) a coil spring that (A) is coupled to the movable shaft secured to the joint within the telecommunications device and, when released, (B) applies a force that presses the heatsink against the optical transducer to ensure that the heatsink is thermally coupled to the optical transducer. Various other apparatuses, systems, and methods are also disclosed.

18 Claims, 13 Drawing Sheets

(56) References Cited

U.S. PATENT DOCUMENTS

| | | | | |
|---|---|---|---|---|
| 7,187,552 B1* | 3/2007 | Stewart | ............... | G06F 1/185 |
| | | | | 257/E23.086 |
| 7,733,652 B2* | 6/2010 | Costello | ............... | H05K 5/0286 |
| | | | | 165/185 |
| 8,289,712 B2* | 10/2012 | Holahan | ............... | H01L 23/433 |
| | | | | 361/709 |
| 8,850,704 B2* | 10/2014 | Ross | ............... | H01L 21/4878 |
| | | | | 29/890.03 |
| 8,911,244 B2* | 12/2014 | Elison | ............... | H05K 7/20409 |
| | | | | 439/137 |
| 2009/0097207 A1* | 4/2009 | Gough | ............... | H05K 7/20445 |
| | | | | 361/704 |
| 2018/0123268 A1* | 5/2018 | Leigh | ............... | G02B 6/36 |

OTHER PUBLICATIONS

MTE Explains: What is Vapor Chamber Cooling?; https://www.maketecheasier.com/what-is-vapor-chamber-cooling (Oct. 24, 2016).

Susheela Nanjunda Rao Narasimhan, et al.; Apparatus, System, and Method for Improving the Efficiency of Heatsinks; U.S. Appl. No. 15/985,668, filed May 21, 2018.

\* cited by examiner

APPARATUS, SYSTEM, AND METHOD FOR IMPROVING HEAT TRANSFER BETWEEN HEATSINKS AND OPTICAL TRANSDUCERS WITHIN TELECOMMUNICATIONS DEVICES

Heatsinks are often a critical component of electronic and mechanical devices. For example, a telecommunications device may include optical transducers that generate heat during operation, thereby causing the operating temperatures of those transducers to rise. If the operating temperatures rise above a certain level, the optical transducers may overheat, malfunction, or even break. To prevent such issues, many optical transducers may be equipped with heatsinks designed to transfer and/or dissipate heat. The heatsinks may include thermally conductive material that transfers heat away from the optical transducers, thereby cooling the optical transducers and/or enabling the them to achieve higher performance.

In addition to the heatsinks themselves, traditional heatsink systems may include some kind of attachment mechanism intended to ensure that the heatsinks maintain sufficient thermal couplings with their corresponding transducers. The size of such attachment mechanisms may be limited by the space available (which is often quite small) within the telecommunications device. Unfortunately, traditional heatsink attachment mechanisms that fit within the available space may lack sufficient force to guarantee that the heatsinks actually maintain sufficient thermal couplings with their corresponding transducers. As a result, the heatsinks may be unable to transfer the maximum amount of heat away from their corresponding transducers.

The instant disclosure, therefore, identifies and addresses a need for additional and improved apparatuses, systems, and methods for improving heat transfer between heatsinks and optical transducers within telecommunications devices.

SUMMARY

As will be described in greater detail below, the instant disclosure generally relates to apparatuses, systems, and methods for improving heat transfer between heatsinks and optical transducers within telecommunications devices. In one example, an apparatus for accomplishing such a task may include (1) a housing unit that houses an optical transducer within a telecommunications device, (2) a heatsink that is coupled to a movable shaft secured to a joint within the telecommunications device, and (3) a coil spring that (A) is coupled to the movable shaft secured to the joint within the telecommunications device and, when released, (B) applies a force that presses the heatsink against the optical transducer to ensure that the heatsink is thermally coupled to the optical transducer.

Similarly, a telecommunications device incorporating the above-described apparatus may include (1) a housing unit that houses an optical transducer, (2) a heatsink that is coupled to a movable shaft secured to a joint within the telecommunications device, and (3) a coil spring that (A) is coupled to the movable shaft secured to the joint within the telecommunications device and, when released, (B) applies a force that presses the heatsink against the optical transducer to ensure that the heatsink is thermally coupled to the optical transducer.

A corresponding method may include (1) coupling a coil spring to a movable shaft that incorporates a heatsink designed to absorb heat generated by an optical transducer within the telecommunications device and (2) securing the movable shaft to a joint within the telecommunications device such that (A) the movable shaft engages the coil spring against a fixed surface of the telecommunications device in a compressed position when the heatsink is lifted away from the optical transducer by a user and (B) the movable shaft releases the coil spring from the compressed position against the fixed surface of the telecommunications device when the heatsink is applied to the optical transducer by a user.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
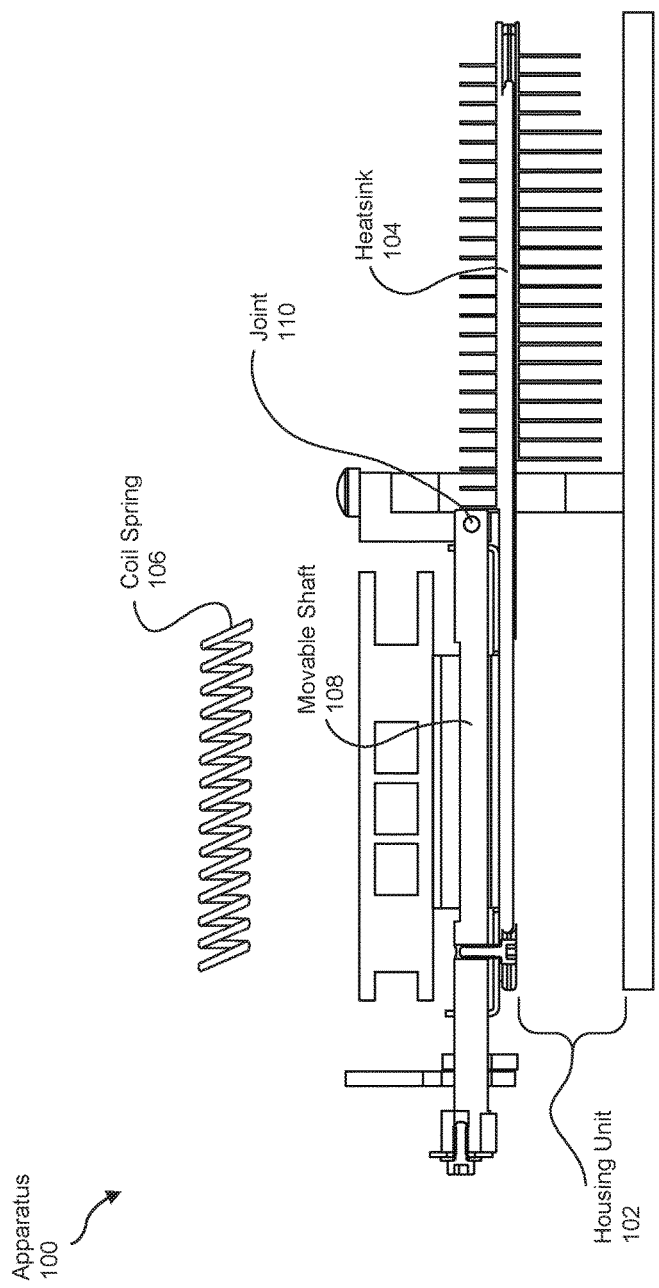
FIG. 1 is an illustration of an exemplary apparatus for improving heat transfer between heatsinks and optical transducers within telecommunications devices.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for improving heat transfer between heatsinks and optical transducers within telecommunications devices. As will be explained in greater detail below, embodiments of the instant disclosure may increase the amount of force and/or pressure applied to heatsinks that are thermally coupled to optical transducers within telecommunications devices. These embodiments may also distribute the force and/or pressure uniformly across the thermal couplings and/or joints between those heatsinks and optical transducers. Additionally or alternatively, embodiments of the instant disclosure may reduce the size requirements of heatsink attachment mechanisms to fit within the limited space available on telecommunications devices.

In other words, embodiments of the instant disclosure may enable strong, forceful heatsink attachment mechanisms to fit within small, tight spaces on telecommunications devices such that other components (e.g., optical transceivers) on the telecommunications devices do not need to be resized and/or spatially modified in any way. Accordingly, these embodiments may achieve stronger thermal couplings without violating and/or increasing the existing cooling device envelope. As a result, these embodiments may facilitate and/or ultimately lead to the installation and use of higher power, higher performance optical transducers with the same device package and/or format.

The following will provide, with reference to FIGS. 1-12, detailed descriptions of an exemplary apparatuses, corresponding implementations, and/or components for improving heat transfer between heatsinks and optical transducers within telecommunications devices. In addition, the discussion corresponding to FIG. 13 will provide a detailed description of an exemplary method for improving heat transfer between heatsinks and optical transducers within telecommunications devices.

FIG. 1 illustrates an exemplary apparatus 100 for improving heat transfer between heatsinks and optical transducers within telecommunications devices. As illustrated in FIG. 1, exemplary apparatus 100 may include and/or represent a housing unit 102, a heatsink 104, a coil spring 106, a movable shaft 108, and/or a joint 110. In this example, housing unit 102 may include and/or represent the physical structure that surrounds and/or forms a space and/or slot in which an optical transducer is inserted and/or installed on a telecommunications device. For example, housing unit 102 may include and/or represent an SFP and/or QSFP socket, port, and/or cage.

Heatsink 104 generally represents any device, structure, and/or mechanism that conducts, transfers, absorbs, and/or sinks heat. Heatsink 104 may be designed for the specific purpose of conducting, transferring, absorbing, and/or sinking heat. In one example, heatsink 104 may be physically coupled to movable shaft 108. In this example, due to the physical coupling, heatsink 104 may move together with movable shaft 108. This movement may enable heatsink 104 to be applied and/or thermally coupled to an optical transducer (not illustrated in FIG. 1) inserted and/or installed in housing unit 102. This movement may also enable heatsink 104 to be removed and/or thermally decoupled from the optical transducer inserted and/or installed in housing unit 102.

Heatsink 104 may be of various shapes and/or dimensions. In some examples, heatsink 104 may form a square, a rectangle, and/or a cube. Additional examples of shapes formed by heatsink 104 include, without limitation, ovals, circles, triangles, diamonds, parallelograms, variations or combinations of one or more of the same, and/or any other suitable shapes. In one example, heatsink 104 may include and/or incorporate a finned and/or pin fin configuration or design.

In some examples, heatsink 104 may be sized in a particular way to maximize the amount of heat transferred from the optical transducer. In one example, heatsink 104 may run the length of one side of the optical module or beyond. Heatsink 104 may include a pedestal that makes physical contact with the optical transducer for the purpose of absorbing heat generated by the optical transducer.

Heatsink 104 may include and/or contain a variety of materials. Examples of such heatsink materials include, without limitation, copper, aluminum, diamond, alloys of one or more of the same, combinations or variations of one or more of the same, and/or any other suitable materials.

Coil spring 106 generally represents any type or form of mechanical apparatus and/or device that stores and/or releases energy or force by way of one or more coils. In one example, coil spring 106 may include and/or represent a canted spring that exhibits and/or provides a uniform load and/or a flat load curve across the working deflection. When compressed, the coils of the canted spring may lay over and/or down to one side. The canted spring may exhibit and/or provide tolerance variation forgiveness. As a result, the canted spring may be readily adaptable to deviations from flatness. Additional examples of coil spring 106 include, without limitation, compression springs, tension springs, extension springs, torsion springs, constant-force springs, combinations or variations of one or more of the same, and/or any other suitable spring.

Coil spring 106 may be of various shapes and/or dimensions. In some examples, the coils of spring 106 may have an elliptical cross section. In other examples, the coils of spring 106 may have a circular cross section.

In some examples, coil spring 106 may be sized in a particular way to maximize the amount of force exerted on heatsink 104. Additionally or alternatively, coil spring 106 may be sized in a particular way to fit within the designated spot and/or location in the telecommunications device.

Coil spring 106 may include and/or contain a variety of materials. Examples of such heatsink materials include, without limitation, metals, copper, aluminum, alloys, plastics, combinations or variations of one or more of the same, and/or any other suitable materials.

Movable shaft 108 generally represents any type or form of physical member, pole, and/or handle. In one example, movable shaft 108 may serve as a base for heatsink 104. In this example, heatsink 104 may be coupled to movable shaft 108, and movable shaft 108 may be secured to the telecommunications device at joint 110. Movable shaft 108 may move, pivot, and/or rotate about and/or around joint 110. Examples of movable shaft 108 include, without limitation, pins, rods, levers, shafts, arms, knobs, portions of one or more of the same, combinations or variations of one or more of the same, or any other suitable shafts.

Movable shaft 108 may be of various shapes and/or dimensions. In some examples, movable shaft 108 may be sized in a particular way to maximize the amount of force exerted on heatsink 104 by coil spring 106. Additionally or alternatively, movable shaft 108 may be sized in a particular way to fit within the designated spot and/or location in the telecommunications device.

Movable shaft 108 may include and/or contain a variety of materials. Examples of such heatsink materials include, without limitation, metals, copper, aluminum, alloys, plastics, combinations or variations of one or more of the same, and/or any other suitable materials.

Joint 110 generally represents any type or form of pivot and/or rotary connection. In one example, joint 110 may include and/or represent a pivot joint around which movable shaft 108 pivots. In another example, joint 110 may include and/or represent a rotary joint around which movable shaft 108 rotates axially.

As an example, housing unit 102 may house an optical transducer within a telecommunications device. In this example, heatsink 104 may be coupled to movable shaft 108 secured to joint 110 within the telecommunications device. In addition, coil spring 106 may be coupled to movable shaft 108 secured to joint 110 within the telecommunications device. When released and/or decompressed, coil spring 106 may apply a force that presses heatsink 104 against the optical transducer to ensure that heatsink 104 is thermally coupled to the optical transducer.

Although FIG. 1 illustrates only a single housing unit, a single heatsink, a single coil spring, a single movable shaft, and a single joint, other embodiments may include and/or incorporate various instances of these components within and/or in connection with a telecommunications device. In other words, a telecommunications device may include multiple instances of apparatus 100 in FIG. 1 and/or its corresponding components. These multiple instances may be independently operable with respect to one another.

Figure 2:
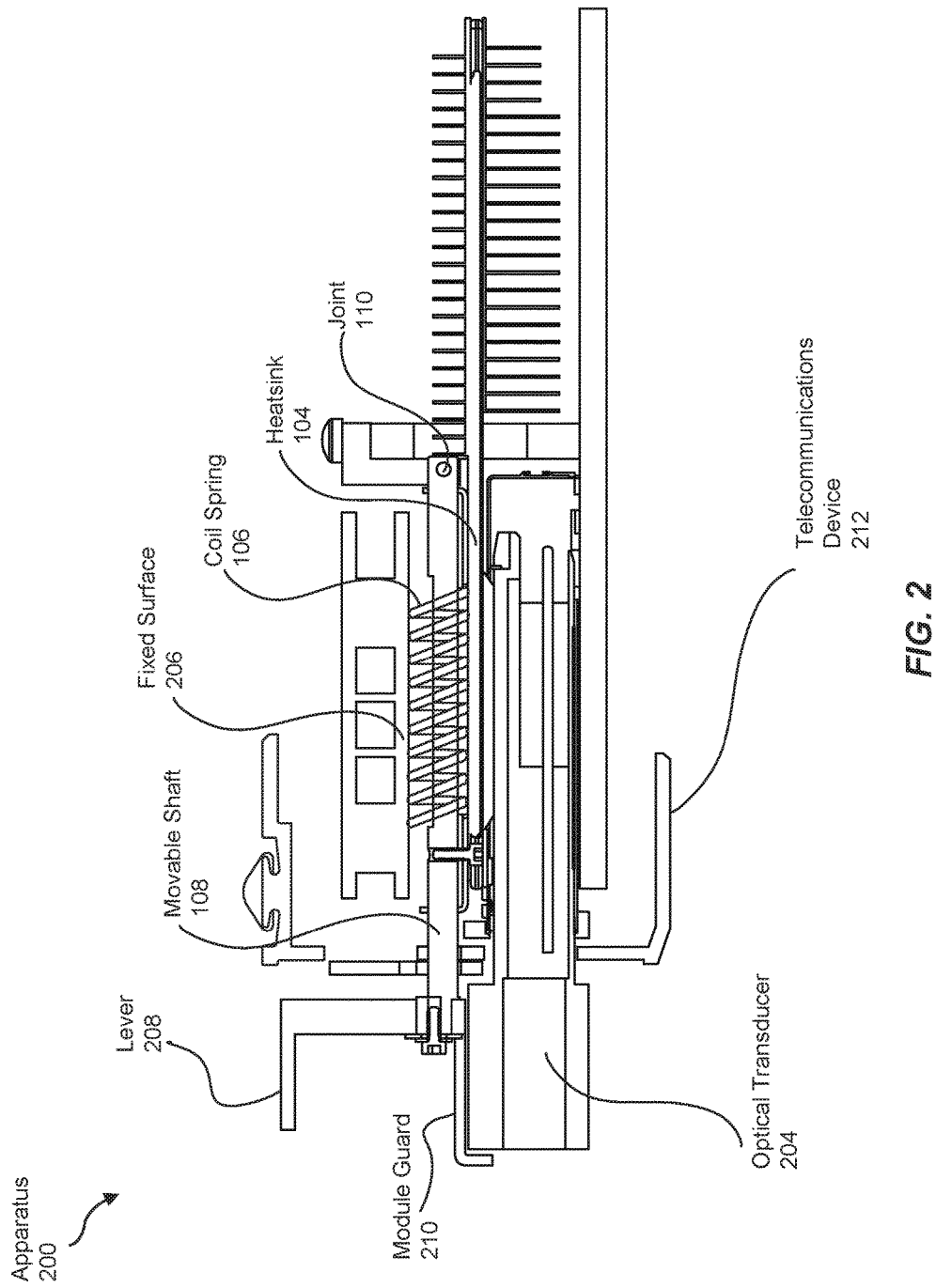
FIG. 2 is an illustration of an exemplary apparatus for improving heat transfer between heatsinks and optical transducers within telecommunications devices.

FIG. 2 illustrates an exemplary apparatus 200 for improving heat transfer between heatsinks and optical transducers within telecommunications devices. As illustrated in FIG. 2, exemplary apparatus 200 may include and/or represent a pivotable coupling implementation. In particular, exemplary apparatus 200 may include and/or represent an optical transducer 204 inserted and/or installed in housing unit 102 of a telecommunications device 212. In this example, coil spring 106 may envelop movable shaft 108 and/or be placed or slid over movable shaft 108. In other words, movable shaft 108 may be inserted, placed, and/or slid through the coils of spring 106.

In some examples, coil spring 106 may press against a fixed surface 206 of telecommunications device 212. In one example, fixed surface 206 may include and/or represent a ceiling and/or top of housing unit 102. In this example, fixed surface 206 may provide resistance to coil spring 106 that causes coil spring to in turn apply force to heatsink 104. This force may amount to and/or represent a uniform load distribution across heatsink 104, thereby maintaining and/or strengthening the thermal coupling between heatsink 104 and/or optical transducer 204.

Optical transducer 204 generally represents any physical device and/or component capable of converting data transmissions between light signals and electrical signals. In one example, optical transducer 204 may include and/or represent an optical transceiver and/or transducer in a fiber optic system. In this example, optical transducer 204 may include (1) a transmitter that uses light (e.g., a laser) to transmit data via a fiber optic channel and/or (2) a detector that detects light to receive data via a fiber optic channel. Optical transducer 204 may include and/or represent a physical, hot-pluggable component.

Optical transducer 204 may be of various shapes and/or dimensions. In one example, optical transducer 204 may be formed in a Small Form-Factor (SFP) pluggable package and/or Quad SFP (QSFP) pluggable package. In this example, optical transducer 204 may support SONET, GIGABIT ETHERNET, FIBRE CHANNEL, and/or other communications standards. Additionally or alternatively, optical transducer 204 may plug into SFP and/or QSFP sockets, ports, and/or cages. Optical transducer 204 may be communicatively coupled to other computing devices via a fiber optic, copper, and/or other network cable. In this way, optical transducer 204 may enable telecommunications device 212 to communicate with such devices within the same network and/or across multiple networks.

Telecommunications device 212 generally represents any network device that facilitates communication among computing devices by way of optical transducers. Examples of telecommunications device 212 include, without limitation, routers (such as provider edge routers, hub routers, spoke routers, autonomous system boundary routers, and/or area border routers), switches, hubs, modems, bridges, repeaters, gateways, multiplexers, network adapters, network interfaces, network racks, chasses, servers, portions of one or more of the same, combinations or variations of one or more of the same, and/or any other suitable telecommunications device.

As illustrated in FIG. 2, exemplary apparatus 200 may also include and/or involve a lever 208 that is coupled to movable shaft 108. In this example, lever 208 may enable movable shaft 108 to be pivoted about joint 110 by a user to facilitate insertion of optical transducer 204 in housing unit 102. For example, a human operator (such as a network administrator) and/or a robotic device may lift lever 208, thereby causing movable shaft 108 to pivot about joint 110 by a few degrees (e.g., between 2 and 4 degrees from the horizontal) and exposing housing unit 102 to access by optical transducer 204. The lifting of lever 208 may also cause coil spring 106 to compress.

Continuing with this example, while lever 208 is lifted, the human operator and/or robotic device may insert and/or install optical transducer 204 into housing unit 102. The human operator and/or robotic device may then release and/or drop lever 208 to engage heatsink 104 against optical transducer 204. As a result, coil spring 106 may release and/or decompress, thereby applying a force that presses heatsink 104 against optical transducer 204 to ensure that heatsink 104 is thermally coupled to optical transducer 204. In this example, fixed surface 206 may provide resistance to one side of coil spring 106, which in turn causes the opposite side of coil spring 106 to press downward against heatsink 104.

Accordingly, when lever 208 is lifted, movable shaft 108 may engage coil spring 106 against fixed surface 206 of telecommunications device 212 in a compressed position. However, when lever 208 is dropped, movable shaft 108 may release coil spring 106 from the compressed position against fixed surface 206 of telecommunications device 212, thereby causing coil spring 106 to apply a force to heatsink 104 and/or thermally couple heatsink 104 with optical transducer 204.

As illustrated in FIG. 2, exemplary apparatus 200 may also include and/or involve a module guard 210 that is coupled to movable shaft 108. In one example, module guard 210 may protect telecommunications device 212 from improper insertion and/or removal of optical transducer 204. In this example, when lever 208 is released, module guard 210 may obstruct and/or block access to housing unit 102. For example, module guard 210 may prevent a human operator and/or robotic device from inserting optical transducer 204 into housing unit 102 while heatsink 104 is engaged and/or in the active position. Additionally or alternatively, module guard 210 may prevent a human operator and/or robotic device from removing optical transducer 204 from housing unit 102 while optical transducer 204 is operational and/or exchanging traffic with other computing devices.

Figure 3:
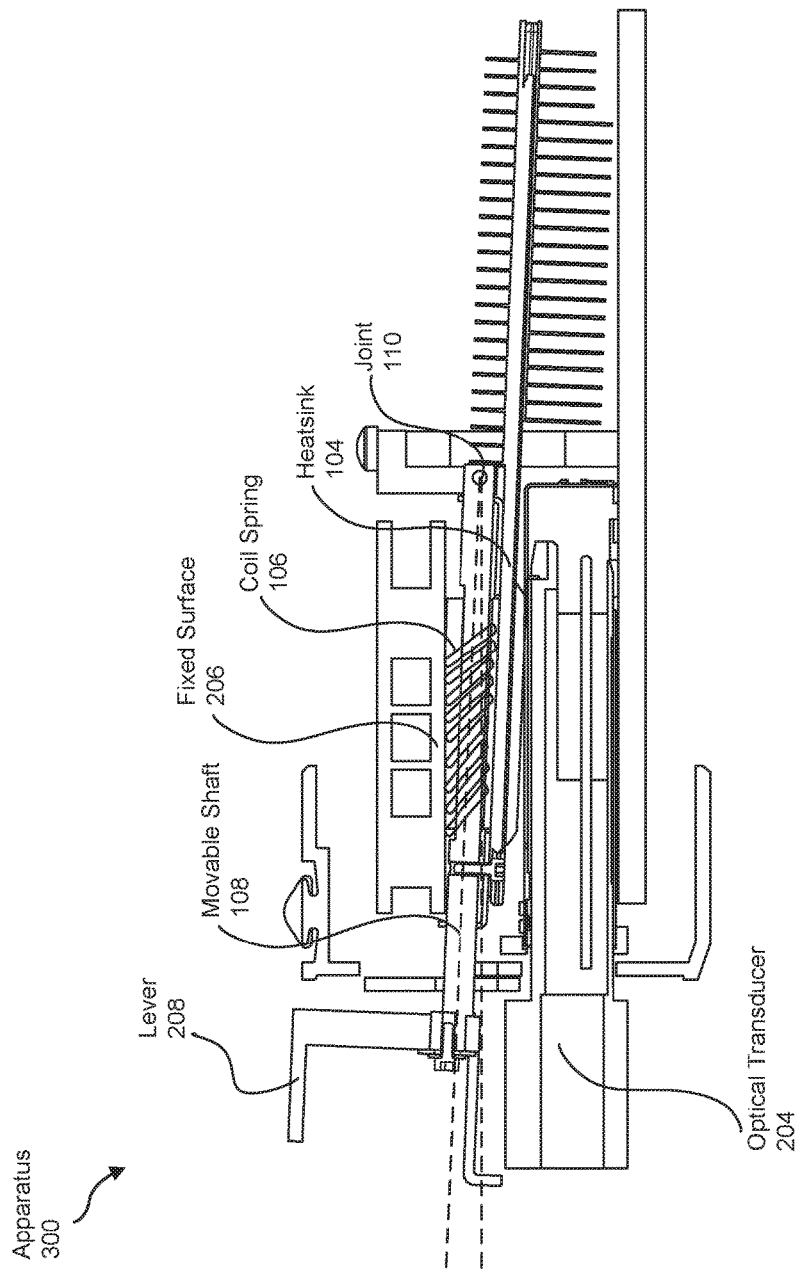
FIG. 3 is illustration of an exemplary apparatus for improving heat transfer between heatsinks and optical transducers within telecommunications devices.

FIG. 3 illustrates an exemplary apparatus 300 for improving heat transfer between heatsinks and optical transducers within telecommunications devices. As illustrated in FIG. 3, exemplary apparatus 200 may include and/or represent an optical transducer 204 inserted and/or installed in housing unit 102 of a telecommunications device 212. In this example, lever 208 may be lifted slightly to facilitate access to housing unit 102. This lifting of lever 208 may cause movable shaft 108 to pivot a few degrees from the horizontal such that a human operator and/or robotic device is able to insert and/or remove optical transducer 204. As a result, coil spring 106 may compress laterally against movable surface due at least in part to the resistance from fixed surface 206.

Figure 4:
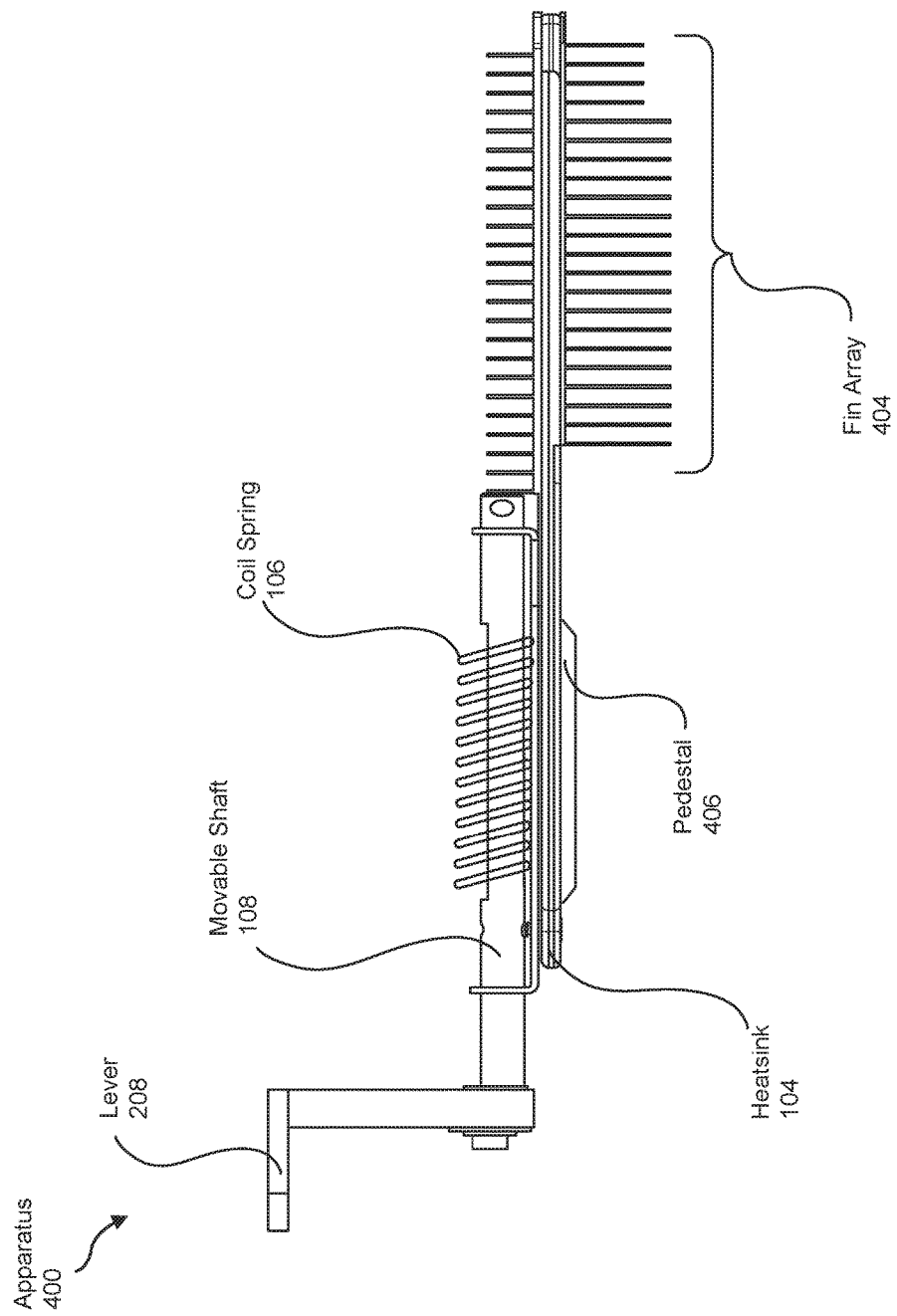
FIG. 4 is an illustration of an exemplary apparatus for improving heat transfer between heatsinks and optical transducers within telecommunications devices.
Figure 5:
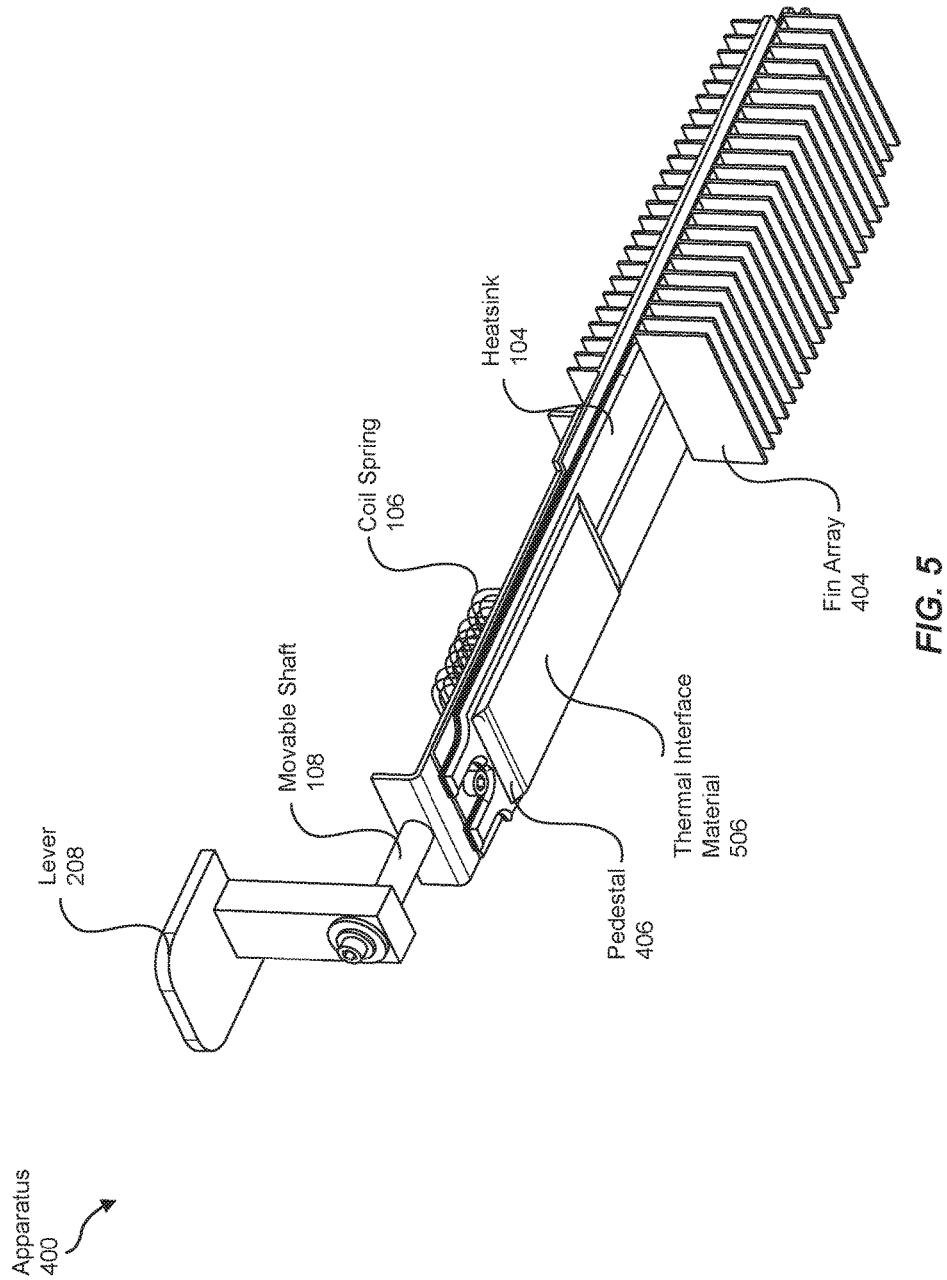
FIG. 5 is an illustration of an exemplary apparatus for improving heat transfer between heatsinks and optical transducers within telecommunications devices.

FIGS. 4 and 5 illustrate different perspectives of an exemplary apparatus 400 for improving heat transfer between heatsinks and optical transducers within telecommunications devices. As illustrated in FIGS. 4 and 5, exemplary apparatus 400 may include and/or represent heatsink 104 coupled to movable shaft 108. In this example, coil spring 106 may slide over movable shaft 108 such that the coils of spring 106 envelop movable shaft 108. In addition, lever 208 may be coupled to movable shaft 108 to facilitate lifting movable shaft 108 when secured to joint 110 within telecommunications device 212.

As illustrated in FIGS. 4 and 5, heatsink 104 may include a pedestal 406 that makes physical contact with optical transducer 204. In this example, pedestal 406 may extend toward and/or into housing unit 102 in which optical transducer 204 is inserted and/or installed in telecommunications device 212. Additionally or alternatively, as coil spring 106 releases and/or decompresses, the coils of spring 106 may press heatsink 104 downward toward optical transducer 204, thereby causing pedestal 406 to make physical contact with optical transducer 204 and/or thermally join heatsink 104 to optical transducer 204.

As illustrated in FIGS. 4 and 5, heatsink 104 may include a fin array 404 that expands the heatsinkable surface area and/or increases heatspreading capabilities. Fin array 404 may include and/or represent a finned structure or configuration. Additionally or alternatively, fin array 404 may include and/or represent a pin fin structure and/or configuration. Fin array 404 may be arranged to extend downward from the base of heatsink 104 and/or upward from the base of heatsink 104.

As illustrated in FIG. 5, heatsink 104 may be equipped with a Thermal Interface Material (TIM) 506 that potentially improves heat transfer and/or thermal coupling capabilities. For example, TIM 506 may be applied to pedestal 406 of heatsink 104 via an adhesive. In this example, TIM 506 may include and/or represent a thermally-conductive layer and/or covering. Like pedestal 406, TIM 506 may make physical contact with optical transducer 204. Accordingly, TIM 506 may be coupled to heatsink 104 such that, when heatsink 104 is pressed against optical transducer 204, TIM 506 sits between pedestal 406 and optical transducer 204.

Figure 6:
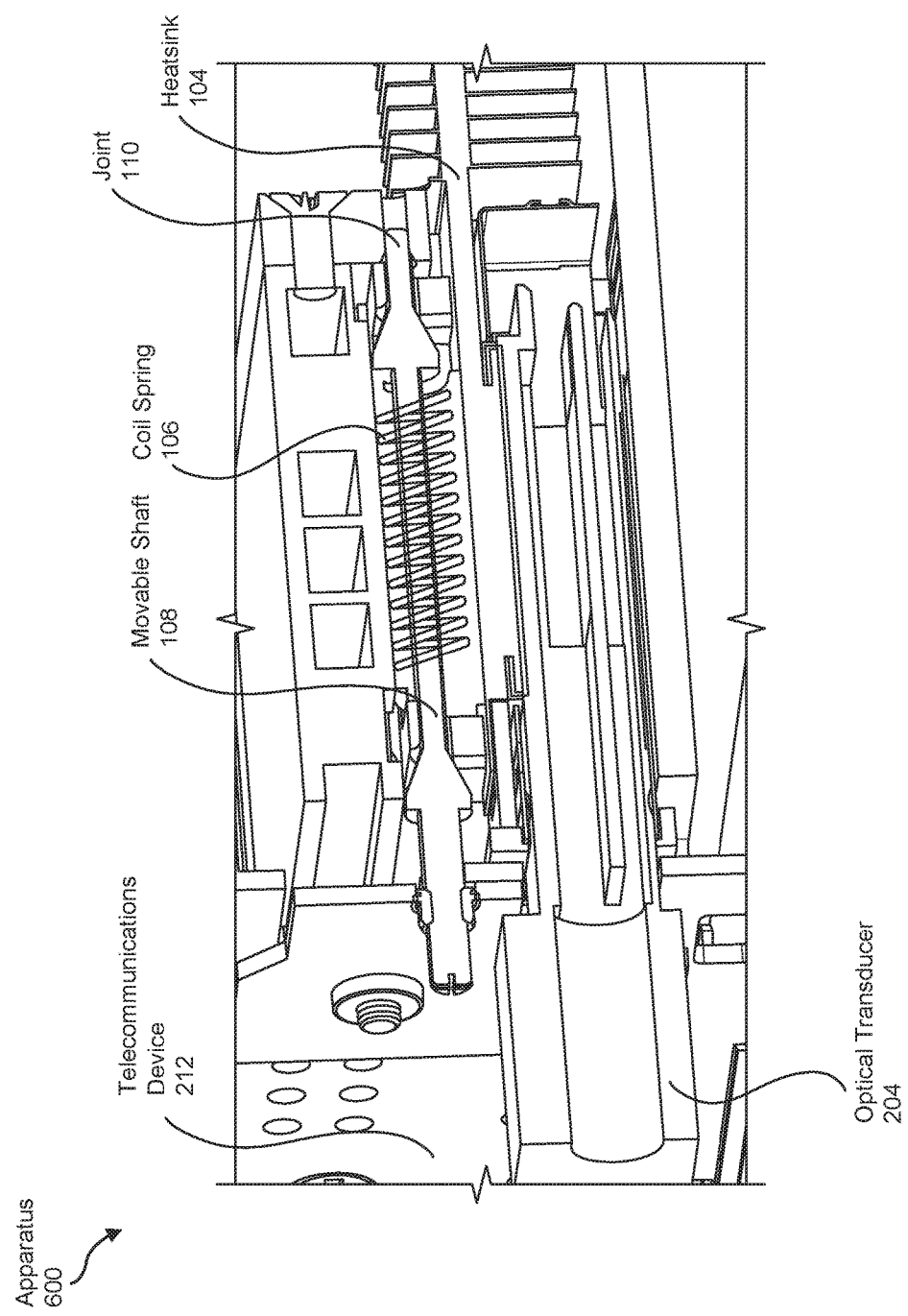
FIG. 6 is an illustration of an exemplary apparatus for improving heat transfer between heatsinks and optical transducers within telecommunications devices.

FIG. 6 illustrates an exemplary apparatus 600 for improving heat transfer between heatsinks and optical transducers within telecommunications devices. As illustrated in FIG. 6, exemplary apparatus 600 may include and/or represent a rotary coupling implementation. In particular, exemplary apparatus 600 may include and/or represent optical transducer 204 inserted and/or installed in housing unit 102 of telecommunications device 212. In this example, movable shaft 108 may be rotated axially to raise and/or lower heatsink 104. For example, by rotating movable shaft 108 clockwise, heatsink 104 may descend toward optical transducer 204 to engage. In this example, by rotating movable shaft 108 counterclockwise, heatsink 104 may ascend away from optical transducer 204 to disengage.

In some examples, as heatsink 104 descends, coil spring 106 may release and/or decompress such that the coils of spring 106 press against heatsink 104, thereby causing heatsink 104 to make physical contact with optical transducer 204 and/or thermally couple heatsink 104 to optical transducer 204. In such examples, as heatsink 104 ascends, coil spring 106 may engage and/or compress such that the coils of spring 106 lay over laterally and/or toward one side.

Figure 7:
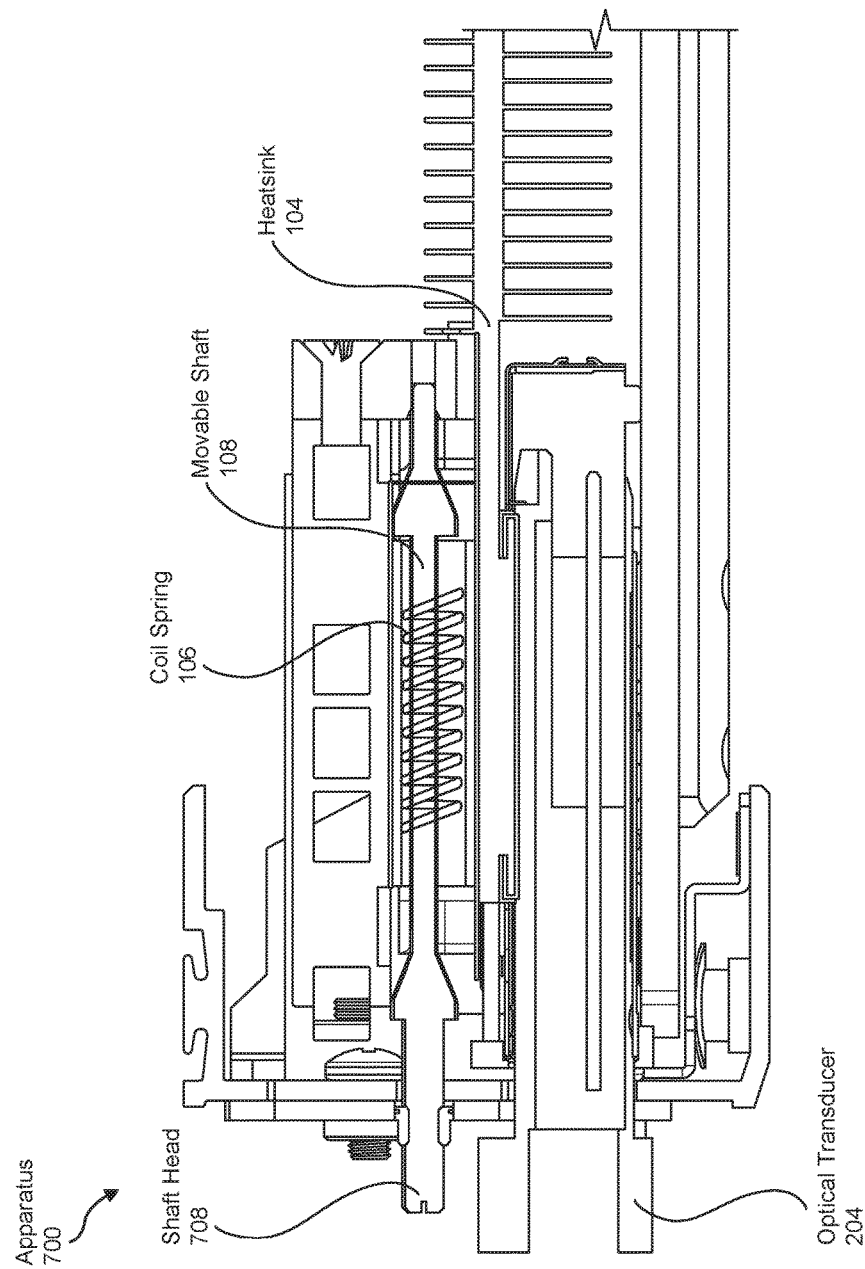
FIG. 7 is an illustration of an exemplary apparatus for improving heat transfer between heatsinks and optical transducers within telecommunications devices.
Figure 8:
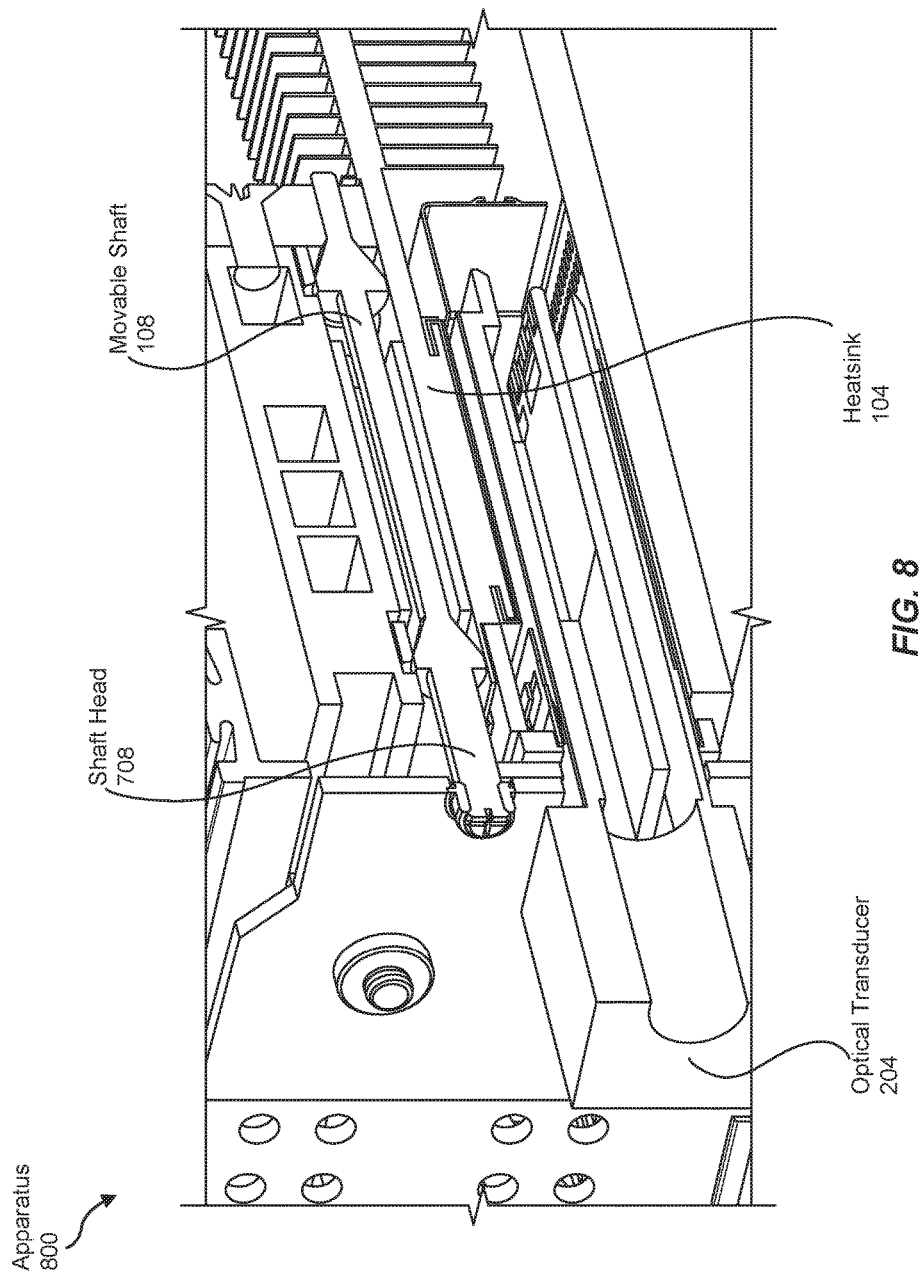
FIG. 8 is an illustration of an exemplary apparatus for improving heat transfer between heatsinks and optical transducers within telecommunications devices.

FIGS. 7 and 8 illustrate an exemplary apparatus 700 for improving heat transfer between heatsinks and optical transducers within telecommunications devices. As illustrated in FIGS. 7 and 8, exemplary apparatus 700 may include and/or represent optical transducer 204 inserted and/or installed in housing unit 102 of telecommunications device 212. In this example, movable shaft 108 may include a shaft head 708 that facilitates the rotation required to raise and/or lower heatsink 104. In one example, shaft head 708 may include and/or represent a screw that interfaces with movable shaft 708.

In some examples, shaft head 708 may be equipped with a gripping mechanism that enables a human operator to simply rotate movable shaft 108 manually and/or by hand (using, e.g., his or her fingers). In other examples, shaft head 708 may be fitted to accept a certain tool with which a human operator and/or robotic device is able to rotate movable shaft 108. For example, shaft head 708 may be fitted for a screwdriver (such as a Phillips or flat head). Additionally or alternatively, shaft head 708 may be fitted for a specific drill bit.

Figure 9:
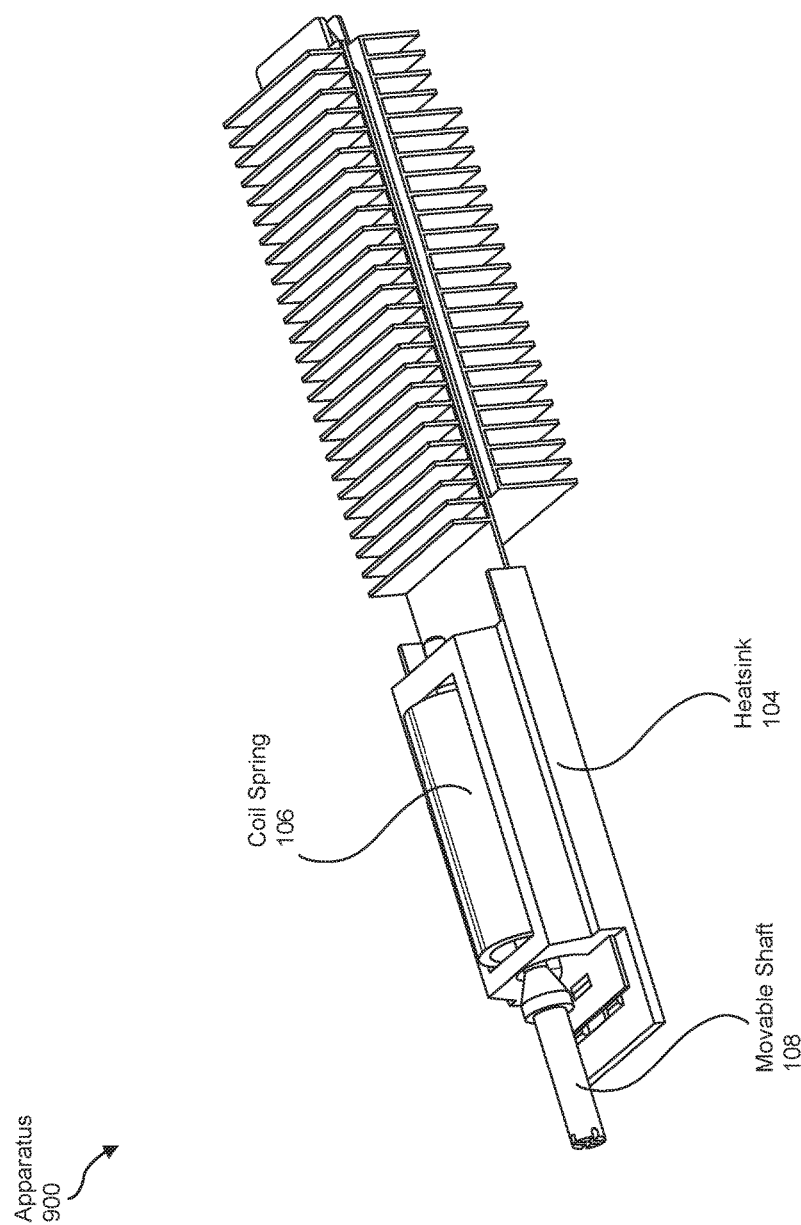
FIG. 9 is an illustration of an exemplary apparatus for improving heat transfer between heatsinks and optical transducers within telecommunications devices.
Figure 10:
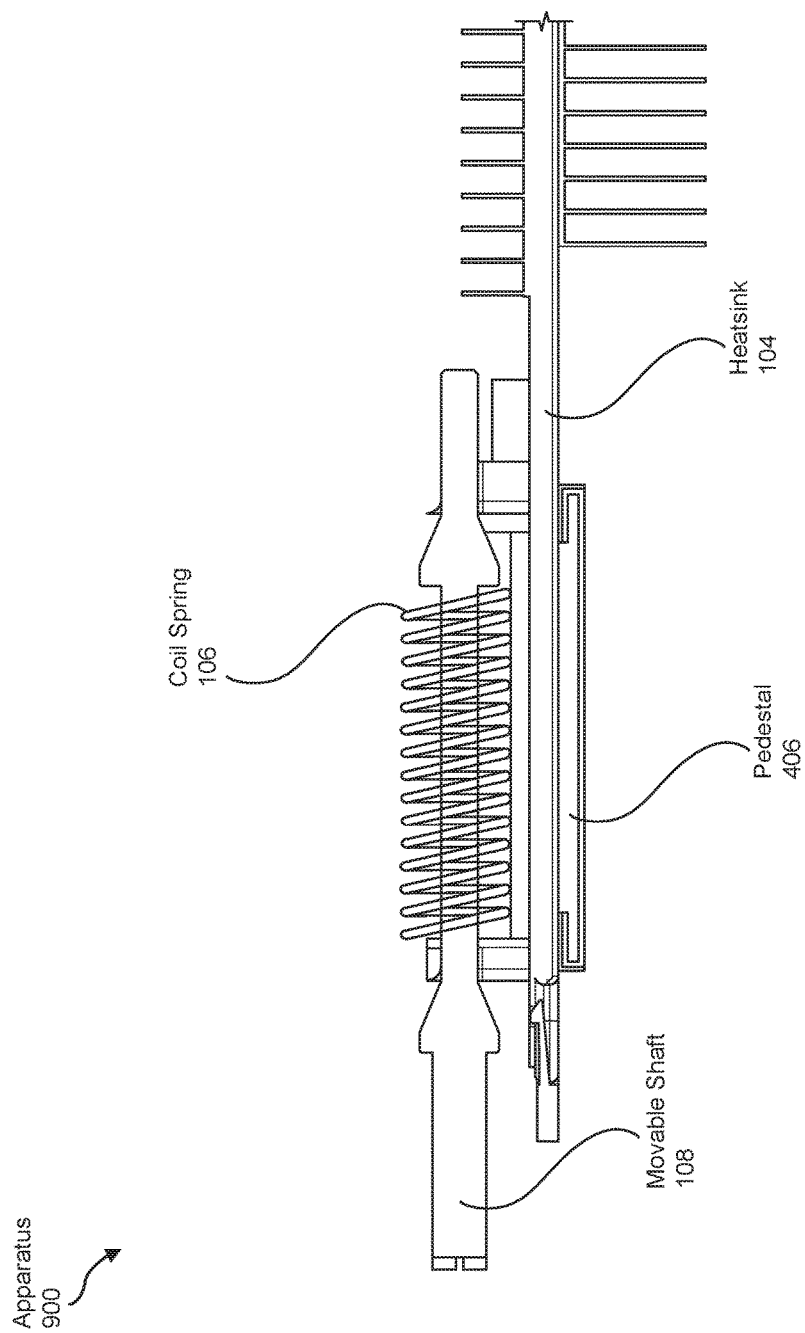
FIG. 10 is an illustration of an exemplary apparatus for improving heat transfer between heatsinks and optical transducers within telecommunications devices.

FIGS. 9 and 10 illustrate different perspectives of an exemplary apparatus 900 for improving heat transfer between heatsinks and optical transducers within telecommunications devices. As illustrated in FIGS. 9 and 10, exemplary apparatus 900 may include and/or represent heatsink 104 coupled to movable shaft 108. In this example, coil spring 106 may slide over movable shaft 108 such that the coils of spring 106 envelop movable shaft 108.

As illustrated in FIG. 10, heatsink 104 may include pedestal 406 that makes physical contact with optical transducer 204. In this example, pedestal 406 may extend toward and/or into housing unit 102 in which optical transducer 204 is inserted and/or installed in telecommunications device 212. Additionally or alternatively, as coil spring 106 releases and/or decompresses, the coils of spring 106 may press heatsink 104 downward toward optical transducer 204, thereby causing pedestal 406 to make physical contact with optical transducer 204 and/or thermally couple heatsink 104 to optical transducer 204.

Figure 11:
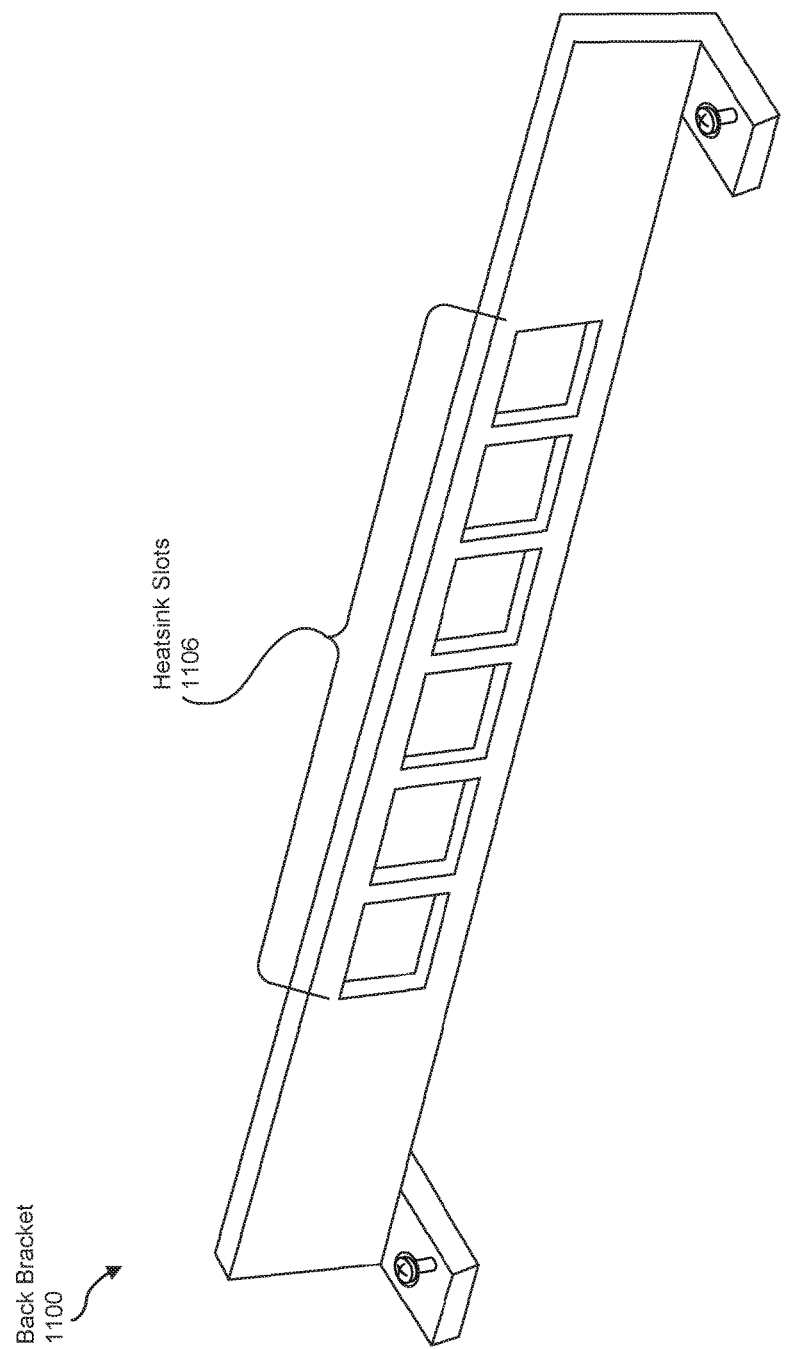
FIG. 11 is an illustration of an exemplary back bracket that supports pivotable heatsinks applied to optical transducers within telecommunications devices.

FIG. 11 illustrates an exemplary back bracket 1100 that supports heatsinks that are pivotably applied to optical transducers within telecommunications devices. As illustrated in FIG. 11, exemplary back bracket 1100 may include a set of heatsink slots 1106 that are each fitted to accept a heatsink (such as heatsink 104 in FIG. 1). For example, and as will be described below in connection with FIG. 12, a portion of heatsink 104 may pass through one of heatsink slots 1106 such that movable shaft 108 is pivotably fastened to a joint coupled to back bracket 110. Once movable shaft 108 is pivotably fastened to the joint in this way, movable shaft 108 may pivot about the joint to facilitate installing and/or removing optical transducer 204 as well as engaging and/or disengaging heatsink 104.

Figure 12:
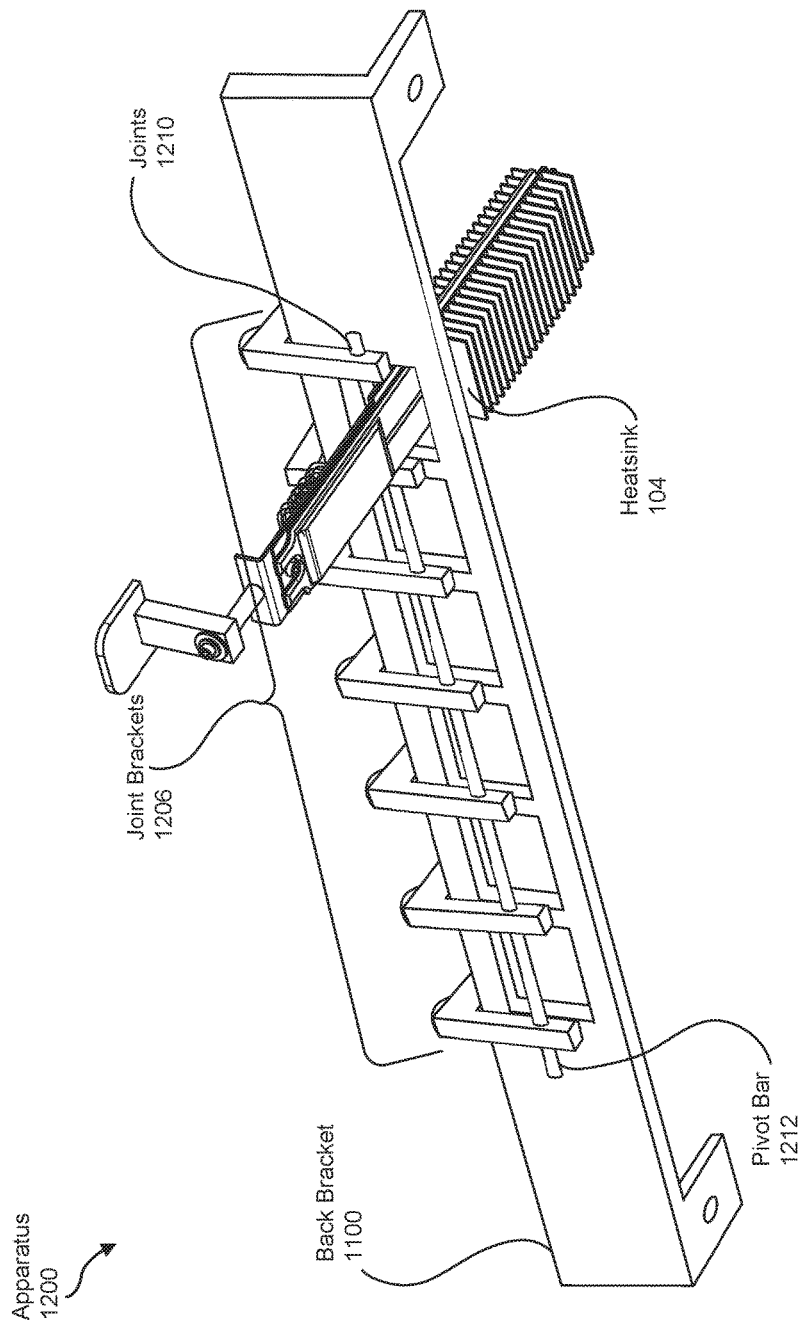
FIG. 12 is an illustration of an exemplary apparatus for improving heat transfer between heatsinks and optical transducers within telecommunications devices.

FIG. 12 illustrates an exemplary apparatus 1200 for improving heat transfer between heatsinks and optical transducers within telecommunications devices. As illustrated in FIG. 12, exemplary apparatus 1200 may include and/or represent heatsink 104 installed in and/or coupled to back bracket 1100. In this example, apparatus 1200 may also include a set of joint brackets 1206 that are mounted and/or coupled to back bracket 1100 around heatsink slots 1106.

In one example, a portion of heatsink 104 may pass through one of heatsink slots 1106 such that movable shaft 108 is pivotably fastened to one of joints 1210. In this example, joints 1210 may be formed at least in part by intersections of joint brackets 1206 and a pivot bar 1212. As a result of this pivotable fastening, movable shaft 108 may pivot about the corresponding joint to facilitate installing and/or removing optical transducer 204 as well as engaging and/or disengaging heatsink 104. Although FIG. 12 illustrates only a single heatsink pivotably installed in heatsink slots 1106 of back bracket 1100, other embodiments may include and/or involve various other heatsinks installed in heatsink slots 1106 in the same way.

Figure 13:
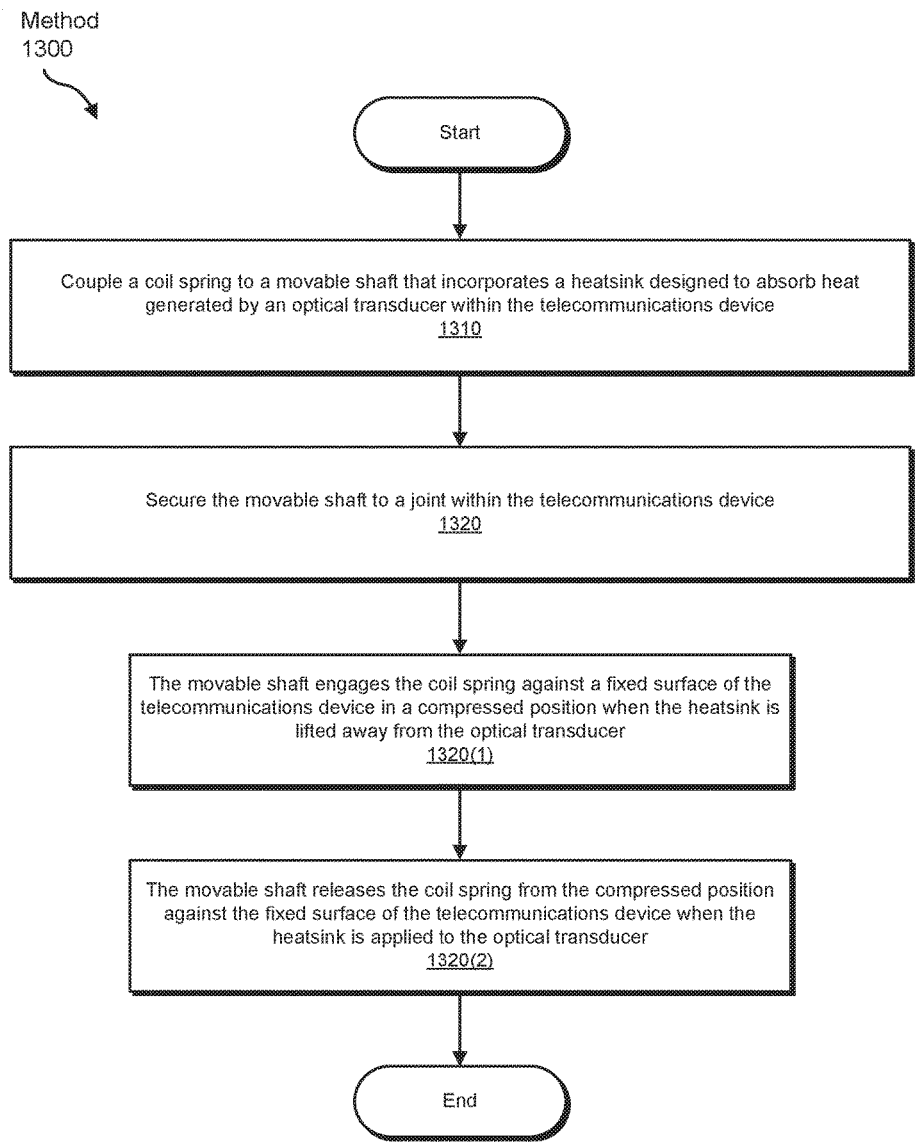
FIG. 13 is a flow diagram of an exemplary method for improving heat transfer between heatsinks and optical transducers within telecommunications devices.

FIG. 13 is a flow diagram of an exemplary method 1300 for improving heat transfer between heatsinks and optical transducers within telecommunications devices. Method 1300 may include the step of coupling a coil spring to a movable shaft that incorporates a heatsink designed to absorb heat generated by an optical transducer within the telecommunications device (1310). Step 1310 may be performed in a variety of ways, including any of those described above in connection with FIGS. 1-12. For example, a computing equipment manufacturer or subcontractor may place movable shaft 108 through coil spring 106. In this example, movable shaft 108 may incorporate and/or be attached to heatsink 104.

Method 1300 may also include the step of securing the movable shaft to a joint within the telecommunications device (1310). Step 1320 may be performed in a variety of ways, including any of those described above in connection with FIGS. 1-12. For example, the computing equipment manufacturer or subcontractor may attach movable shaft 108 to a pivot joint within telecommunications device 212. Alternatively, the computing equipment manufacturer or subcontractor may attach movable shaft 108 to a rotary joint within telecommunications device 212.

As illustrated in FIG. 13, step 1320 may effectuate and/or facilitate certain features. In particular, upon being secured to the joint in this way, the movable shaft may engage the coil spring against a fixed surface of the telecommunications device in a compressed position when the heatsink is lifted away from the communications device (1320(1)). Additionally or alternatively, the movable shaft may disengage the coil spring from the compressed position against the fixed surface of the telecommunications device when the heatsink is applied to the communications device (1320(2)).

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    a housing unit that houses an optical transducer within a telecommunications device;
    a heatsink that is coupled to a movable shaft secured to a joint within the telecommunications device; and
    a coil spring that:
        includes a plurality of coils that envelop the movable shaft secured to the joint within the telecommunications device; and
        when released, presses against a fixed surface of the telecommunications device, wherein the fixed surface provides resistance to the plurality of coils and causes the plurality of coils to apply a force that presses the heatsink against the optical transducer to ensure that the heatsink is thermally coupled to the optical transducer.

2. The apparatus of claim 1, wherein the coil spring comprises a canted spring that envelopes the movable shaft secured to the joint.

3. The apparatus of claim 1, wherein the joint comprises a pivot joint; and
    further comprising a lever that:
        is coupled to the movable shaft; and
        enables the movable shaft to be pivoted about the pivot joint by a user to facilitate insertion of the optical transducer in the housing unit.

4. The apparatus of claim 1, further comprising a module guard that:
 is coupled to the movable shaft; and
 prevents removal of the optical transducer when the heatsink is pressed against the optical transducer by the coil spring.

5. The apparatus of claim 1, wherein the heatsink comprises at least one of:
 a pedestal that makes physical contact with the optical transducer; and
 a fin array that expands a surface area of the heatsink.

6. The apparatus of claim 5, further comprising a thermal interface material that:
 is coupled to the pedestal of the heatsink; and
 when the heatsink is pressed against the optical transducer, sits between the pedestal of the heatsink and the optical transducer.

7. The apparatus of claim 1, wherein the movable shaft comprises a rotatable drive shaft that:
 is secured to the joint within the telecommunications device; and
 rotates in one direction to engage the heatsink by applying the heatsink to the optical transducer; and
 rotates in another direction to disengage the heatsink by lifting the heatsink away from the optical transducer.

8. The apparatus of claim 1, wherein the optical transducer comprises at least one of:
 an optical module; and
 a Quad Small Form-factor Pluggable (QSFP) module.

9. The apparatus of claim 1, further comprising:
 an additional housing unit that houses an additional optical transducer within the telecommunications device;
 an additional heatsink that is coupled to an additional movable shaft secured to the joint within the telecommunications device; and
 an additional coil spring that:
  is coupled to the additional movable shaft secured to the joint within the telecommunications device; and
  when released, applies an additional force that presses the additional heatsink against the additional optical transducer to ensure that the additional heatsink is thermally coupled to the additional optical transducer.

10. The apparatus of claim 9, wherein the movable shaft and the additional movable shaft are independently movable with respect to one another.

11. A telecommunications device comprising:
 a housing unit that houses an optical transducer;
 a heatsink that is coupled to a movable shaft secured to a joint within the telecommunications device; and
 a coil spring that:
  includes a plurality of coils that envelop the movable shaft secured to the joint within the telecommunications device; and
  when released, presses against a fixed surface of the telecommunications device, wherein the fixed surface provides resistance to the plurality of coils and causes the plurality of coils to apply a force that presses the heatsink against the optical transducer to ensure that the heatsink is thermally coupled to the optical transducer.

12. The telecommunications device of claim 11, wherein the coil spring comprises a canted spring that envelopes the movable shaft secured to the joint.

13. The telecommunications device of claim 11, wherein the joint comprises a pivot joint; and
 further comprising a lever that:
  is coupled to the movable shaft; and
  enables the movable shaft to be pivoted about the pivot joint by a user to facilitate insertion of the optical transducer in the housing unit.

14. The telecommunications device of claim 11, further comprising a module guard that:
 is coupled to the movable shaft; and
 prevents removal of the optical transducer when the heatsink is pressed against the optical transducer by the coil spring.

15. The telecommunications device of claim 11, wherein the heatsink comprises at least one of:
 a pedestal that makes physical contact with the optical transducer; and
 a fin array that expands a surface area of the heatsink.

16. The telecommunications device of claim 15, further comprising a thermal interface material that:
 is coupled to the heatsink; and
 when the heatsink is pressed against the optical transducer, sits between the pedestal of the heatsink and the optical transducer.

17. The telecommunications device of claim 11, wherein the movable shaft comprises a rotatable drive shaft that:
 is secured to the joint within the telecommunications device;
 rotates in one direction to engage the heatsink by applying the heatsink to the optical transducer; and
 rotates in another direction to disengage the heatsink by lifting the heatsink away from the optical transducer.

18. A method comprising:
 enveloping a plurality of coils from a coil spring around a movable shaft that incorporates a heatsink designed to absorb heat generated by an optical transducer within a telecommunications device; and
 securing the movable shaft to a joint within the telecommunications device such that:
  the movable shaft engages the plurality of coils against a fixed surface of the telecommunications device in a compressed position when the heatsink is lifted away from the optical transducer by a user; and
  the movable shaft releases the plurality of coils from the compressed position against the fixed surface of the telecommunications device when the heatsink is applied to the optical transducer by the user.

* * * * *